United States Patent
Hirano et al.

(10) Patent No.: US 10,811,392 B2
(45) Date of Patent: Oct. 20, 2020

(54) TSV SEMICONDUCTOR DEVICE INCLUDING TWO-DIMENSIONAL SHIFT

(71) Applicant: WESTERN DIGITAL TECHNOLOGIES, INC., San Jose, CA (US)

(72) Inventors: Toshiki Hirano, San Jose, CA (US); Vipin Ayanoor-Vitikkate, Pleasanton, CA (US); Nagesh Vodrahalli, Los Altos, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/287,737

(22) Filed: Feb. 27, 2019

(65) Prior Publication Data
US 2020/0273844 A1 Aug. 27, 2020

(51) Int. Cl.
  *H01L 25/065* (2006.01)
  *H01L 21/768* (2006.01)
  *H01L 23/00* (2006.01)
  *H01L 25/00* (2006.01)

(52) U.S. Cl.
  CPC .... *H01L 25/0657* (2013.01); *H01L 21/76898* (2013.01); *H01L 25/50* (2013.01); *H01L 24/13* (2013.01); *H01L 24/32* (2013.01); *H01L 2224/13025* (2013.01); *H01L 2224/1413* (2013.01); *H01L 2224/32145* (2013.01); *H01L 2225/06544* (2013.01); *H01L 2225/06562* (2013.01)

(58) Field of Classification Search
None
See application file for complete search history.

(56) References Cited

U.S. PATENT DOCUMENTS

| 2009/0045525 A1* | 2/2009 | Matsushima | ......... H01L 21/568 257/777 |
| 2011/0127679 A1* | 6/2011 | Eun | ...................... H01L 23/481 257/774 |
| 2011/0227217 A1* | 9/2011 | Suh | ...................... H01L 21/561 257/737 |
| 2011/0309525 A1 | 12/2011 | Nasu et al. | |
| 2015/0357310 A1* | 12/2015 | Kim | ...................... H01L 24/92 257/774 |

FOREIGN PATENT DOCUMENTS

| TW | 201401481 | 1/2014 |
| TW | 201501226 | 1/2015 |
| TW | 201507087 | 2/2015 |

OTHER PUBLICATIONS

Office Action dated Jul. 15, 2020 in Taiwanese Patent Application No. 108142438, with machine translation.
(Continued)

*Primary Examiner* — Herve-Louis Y Assouman
(74) *Attorney, Agent, or Firm* — Vierra Magen Marcus LLP

(57) ABSTRACT

A semiconductor device is disclosed including semiconductor dies stacked with an offset in two orthogonal directions. TSVs may then be formed connecting corresponding die bond pads on respective dies in the stack. By offsetting the dies in two orthogonal directions, the overall stepped offset, and consequently the size of the unused keep-out area of the stack, is reduced.

22 Claims, 12 Drawing Sheets

(56) References Cited

OTHER PUBLICATIONS

English language Abstract for TW201401481 published Jan 1, 2014.
English language Abstract for TW201507087 published Feb. 16, 2015.
English language Abstract for TW201501226 published Jan. 1, 2015.

* cited by examiner

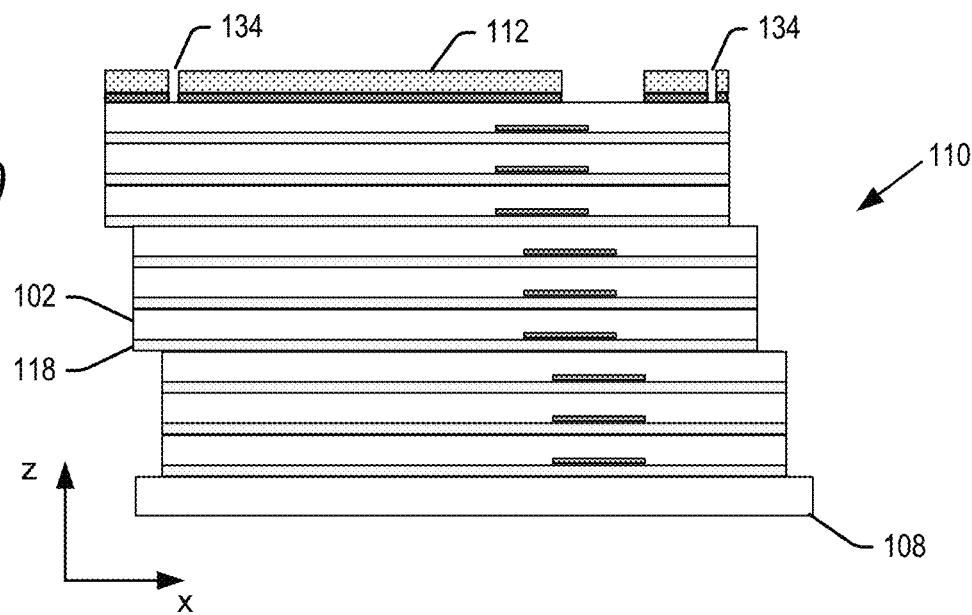
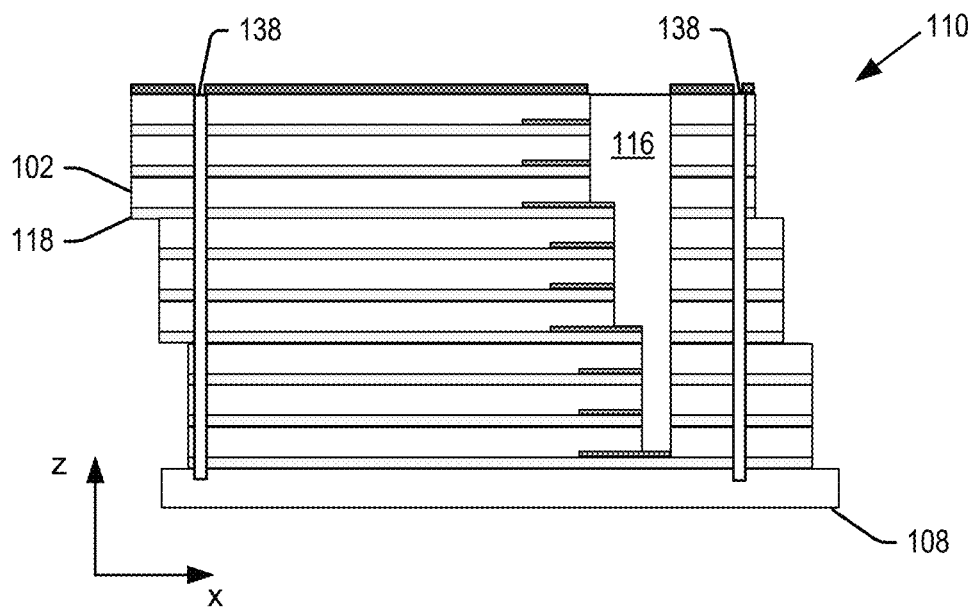

TSV SEMICONDUCTOR DEVICE INCLUDING TWO-DIMENSIONAL SHIFT

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate. The die in such packages are often stacked in a stepped offset pattern so that the die bond pads of each die are exposed at the stepped edge of the die stack. Wire bonds may then be formed between corresponding die bond pads of the die in the die stack, and to the substrate to allow signal exchange to/from select die in the die stack.

Some memory and IC companies are moving away from wire bonding toward an emerging technology that uses through silicon vias (TSV), in which the wire bonds are replaced by metal or conductive traces running through a wafer or die from top to bottom. This allows wafers or chips to be stacked on top of each other and electrically and mechanically bonded. TSV interconnects have a lot of advantages, such as higher pin-out count, lower impedance that allows higher data rates, die size reduction and reduced interconnect length, thus improving latency.

One method of TSV bonding involves stacking die with a stepped offset in one direction, and then creating a via from the top surface to the bottom die in the stack. The offset allows access to each of the die bond pads at each level in the die stack. However, the process of shifting the die along one dimension leads to a large wasted keep-out area on each die at the stepped edge, since no TSV or IC components can be built in the keep-out area at the edge.

DESCRIPTION OF THE DRAWINGS

FIGS. 20-22 are cross-sectional side views of a semiconductor device with simultaneous fabrication of a through silicon via and dicing of the device from a wafer stack according to embodiments of the present technology.

DETAILED DESCRIPTION

The present technology will now be described with reference to the figures, which in embodiments, relate to a semiconductor device including semiconductor dies stacked with an offset in two orthogonal directions. TSVs may then be formed connecting corresponding die bond pads on respective dies in the stack. By offsetting the dies in two directions, the overall stepped offset, and consequently the size of the unused keep-out area of the stack, is reduced.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
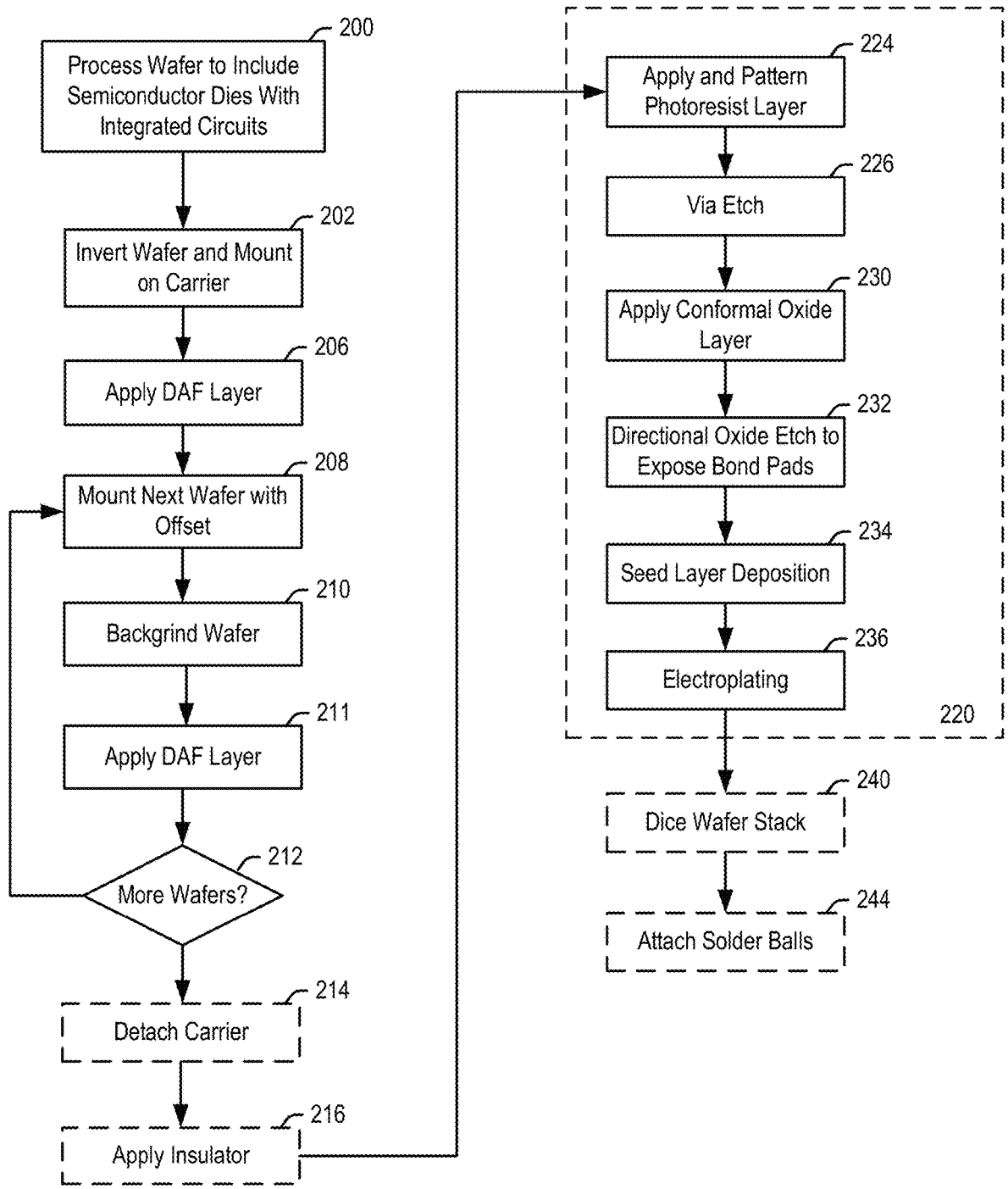
FIG. 1 is a flowchart for forming a semiconductor device according to embodiments of the present technology.
Figure 2:
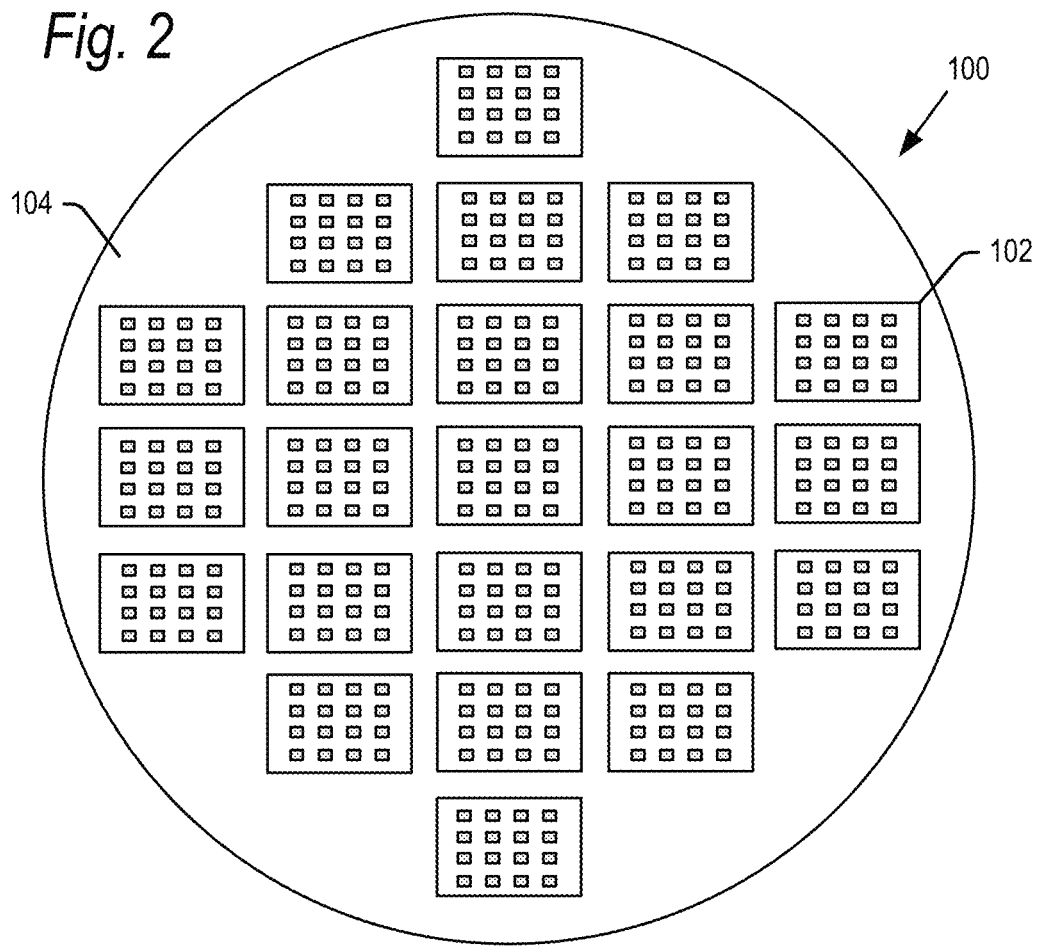
FIG. 2 is a plan view of a first major surface of a first semiconductor wafer according to embodiments of the present technology.

An embodiment of the present technology will now be explained with reference to the flowchart of FIG. 1, and the views of FIGS. 2-24. In step 200, a semiconductor wafer 100 may be processed into a number of semiconductor dies 102 as shown in FIG. 2. Although not critical to the present technology, the semiconductor wafer 100 may start as an ingot of wafer material which may be monocrystalline silicon grown according to either a Czochralski (CZ) or floating zone (FZ) process. The wafer 100 may be formed of other materials and by other processes in further embodiments.

The semiconductor wafer 100 may be cut from the ingot and polished on both the first major surface (active surface) 104, and second major surface (inactive surface, not shown) opposite surface 104, to provide smooth surfaces. The first major surface 104 may undergo various processing steps to divide the wafer 100 into the respective semiconductor dies 102, and to form integrated circuits of the respective semiconductor dies 102 on and/or in the first major surface 104. These various processing steps may include metallization steps depositing metal contacts including die bond pads 106 exposed on the first major surface 104. The metallization steps may further include depositing metal interconnect layers and vias within the wafer. These metal interconnect layers and vias may be provided for transferring signals to and from the integrated circuits, and to provide structural support to the integrated circuits as is known.

Figure 3:
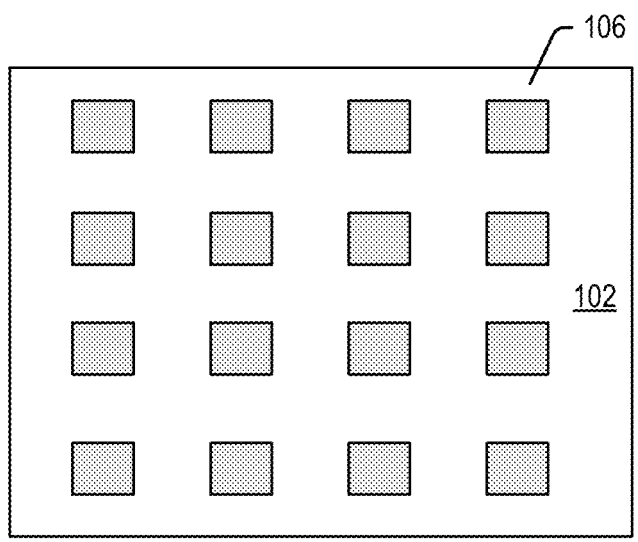
FIG. 3 is a plan view of a semiconductor die from the wafer shown in FIG. 2 according to embodiments of the present technology.

The number of semiconductor dies 102 shown on wafer 100 in FIG. 2 is for illustrative purposes, and wafer 100 may include more semiconductor dies 102 than are shown in further embodiments. Similarly, the number and pattern of bond pads 106 on the semiconductor dies 102 in FIGS. 2 and 3 are shown for illustrative purposes, and the dies 102 may include bond pads 106 in different patterns and in different numbers than are shown in further embodiments. As explained below, dies 102 are stacked and electrically interconnected using TSVs, which allow the die bond pads 106 to be distributed across the surface of the dies 102.

The semiconductor die 102 may for example be a memory die such as 2D NAND flash memory or 3D BiCS (Bit Cost Scaling), V-NAND or other 3D flash memory. However, die 102 may be other types of dies, including for example a controller die such as an ASIC, or RAM such as an SDRAM, DDR SDRAM, LPDDR and GDDR.

Referring again to FIG. 1, after the wafer 100 is processed and dies 102 are formed, the wafer 100 may be flipped over and mounted on a carrier 108 (FIG. 4) with a removable adhesive in step 202. The carrier may be any of various materials, including for example Silicon, Silicon Dioxide, glass or a polymer. In step 206, a layer of die attach film (DAF) may be applied to the back (inactive) surface of the wafer, as by lamination. Alternatively, liquid-form adhesive material can be applied to the back surface by spin-coating, followed by baking process.

In steps 208, 210, 211 and 212, additional wafers 100 may be stacked onto the first wafer 100 with a two-dimensional offset as will be explained with reference to FIGS. 4-10. The additional wafers 100 may be fabricated as described above to include dies 102 and die bond pads 106. In particular, it is important that the dies 102 and die bond pads 106 be formed in the same corresponding positions on each wafer. That is, if the wafers 100 were stacked without any offset (completely aligned with each other), the corresponding die bond pads on each wafer would also be in complete alignment with each other. Thus, the offset of first and second adjacent wafers results in the same offset of each pair of corresponding die bond pads in the first and second wafers.

Figure 4:
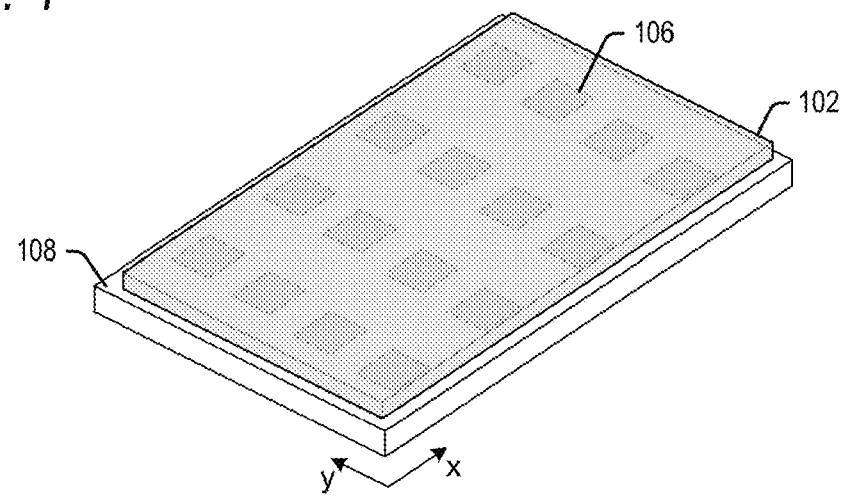
FIGS. 4-6 are perspective views of dies being stacked with an offset in a first direction according to embodiments of the present technology.

FIG. 4 shows an individual die 102 mounted on a carrier 108. While FIG. 4 and subsequent figures show only a single die 102 on a portion of carrier 108, it is understood that, in embodiments, the die 102 is still part of (not yet diced from) the wafer 100 when the dies and wafers are stacked so as to achieve economies of scale. In embodiments, the carrier 108 may be at least as large as the wafer 100. As explained below, in further embodiments, the individual dies 102 may be diced from the wafer 100 prior to stacking, and subsequently stacked with two-dimensional offsets after dicing. The wafer 100 is shown partially transparent in FIG. 4. The die bond pads 106 are visible on a bottom surface of the wafer 100, facing the carrier 108.

Figure 5:
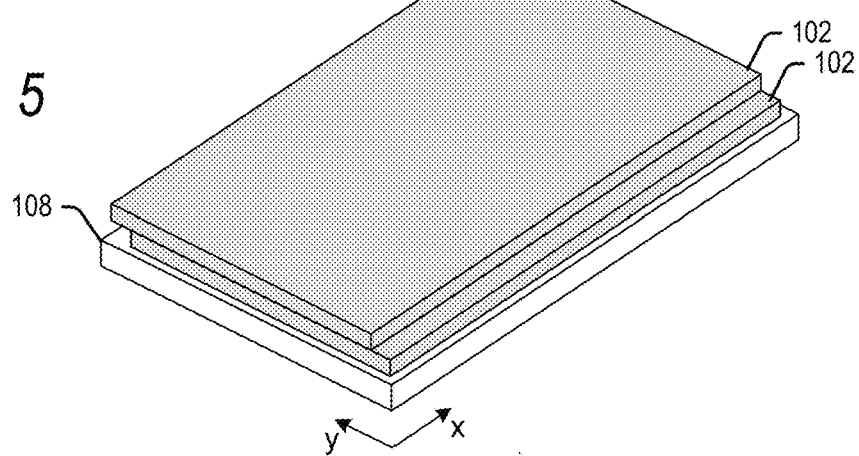

As shown in FIG. 5, in step 208, another wafer 100 including dies 102 may be stacked on the first wafer 100, such that the wafers and corresponding dies are offset in a first direction, for example in the y-direction. As used herein, 'corresponding' dies and 'corresponding' die bond pads refers to dies and die bond pads in different levels of wafers that would be directly aligned with each other if the wafers were stacked without any offset. The second wafer may be offset along the y-axis by a few microns, such for example 2 μm to 5 μm, though the offset may be greater or lesser than that in further embodiments.

In step 210, the back (inactive) surface of the newly stacked wafer may undergo a back-grinding process to thin the wafer, and in step 211 an adhesive layer, either DAF or liquid adhesive, may be applied to the inactive surface. In further embodiments, the newly stacked wafer may undergo the back-grind process and DAF layer application before the wafer is added to the wafer stack. The wafer stack may include various numbers of wafers 100. If another wafer 100 is to be added to the stack in step 212, steps 208, 210 and 211 are repeated for the additional wafer. The only thing that may differ is a direction of the offset as explained below.

Figure 6:
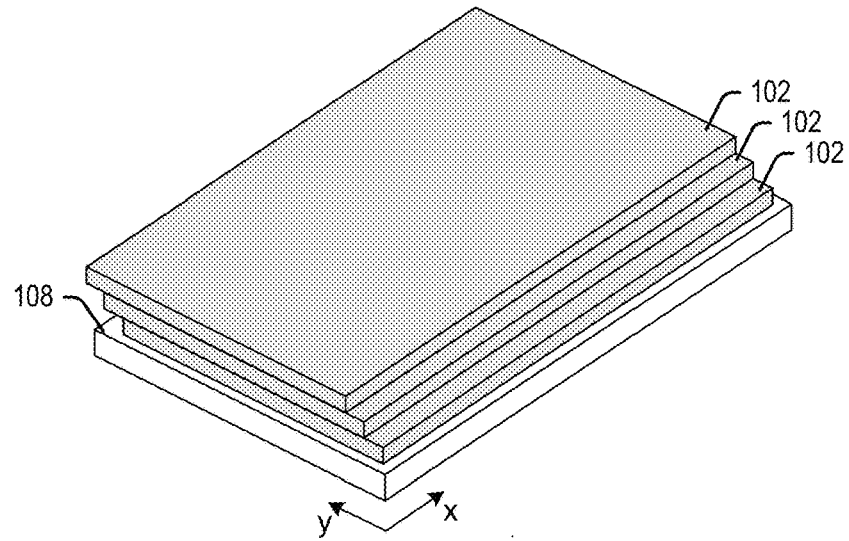

For example, FIG. 6 shows an additional (a third) wafer 100 added to the stack and offset in the first direction, i.e., the y-direction. The third wafer 100 may be mounted on top of the second wafer 100 with the same or different offset as compared to the offset of the first and second wafers 100.

Figure 7:
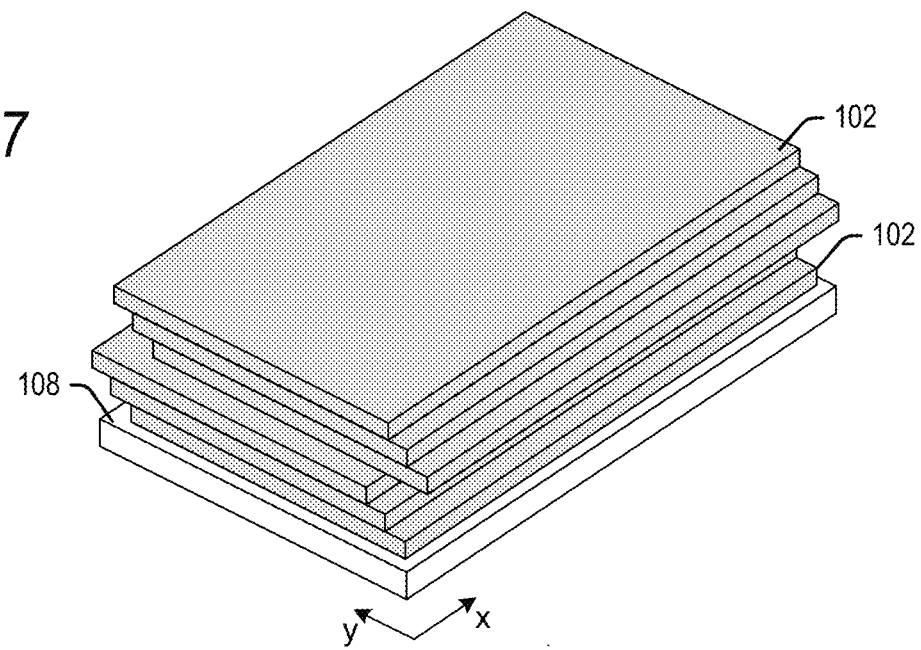
FIGS. 7-8 are perspective views of sets of dies being stacked with an offset in a second direction according to embodiments of the present technology.

FIG. 7 shows additional wafers 100 added to the wafer stack. In particular, FIG. 7 shows a second set of three wafers mounted on top of the first set of three wafers shown for example in FIG. 6. The second set of wafers may also be offset along the y-axis as in the first set. However, the second set of three wafers is also offset in a second direction, i.e., along the x-axis, with respect to the first set of three wafers. The second set of three wafers may be offset along the x-axis by a few microns, such for example 2 μm to 5 μm, though the offset may be greater or lesser than that in further embodiments. The second set of three wafers may be aligned over the first set of three wafers along the y-axis. That is, the bottommost wafer of the second set of wafers may be aligned over the bottommost wafer of the first set of wafers along the y-axis. However, the second set of wafers may be offset from the first set of wafers along the y-axis in further embodiments.

Figure 8:
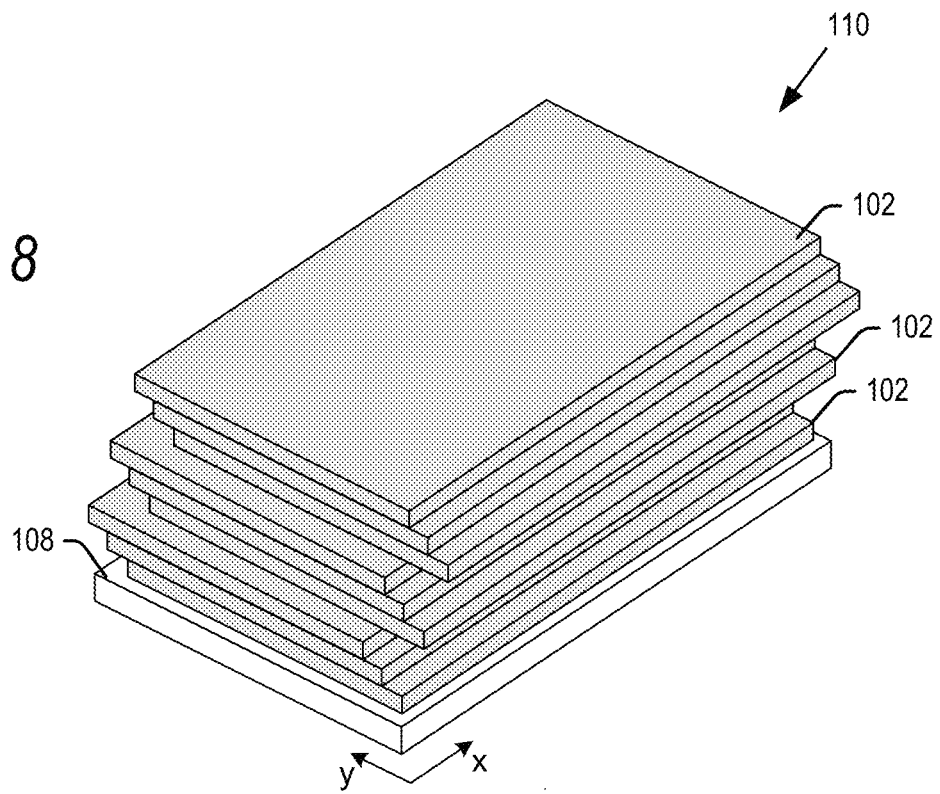

FIG. 8 shows a third set of three wafers mounted on top of the second set which again may be offset along the x-axis with respect to the second set of three wafers. The second set of three wafers may be offset along the x-axis by a few microns, such for example 2 μm to 5 μm, though the offset may be greater or lesser than that in further embodiments. The third set of three wafers may be aligned over the second set of three wafers along the y-axis, but may be offset along the y-axis in further embodiments.

FIG. 8 shows dies 102 of wafers 100 arranged into a stack 110 with two-dimensional offsets along the x- and y-axes. Again, as noted, the dies 102 shown FIG. 8 may still be part of their respective wafers 100. In embodiments, the x- and y-axes are orthogonal to each other, but it is conceivable that the x- and y-axes form a non-right angle of other than 90° with respect to each other in further embodiments. In the example of FIG. 8, wafers are stacked on each other with an offset in a first direction to form sets of wafers, and then those sets of wafers are stacked on each other with an offset in a second direction. It is understood that the wafers in stack 110 may be formed with two-dimensional offsets in any of a wide variety of other configurations.

Figure 9:
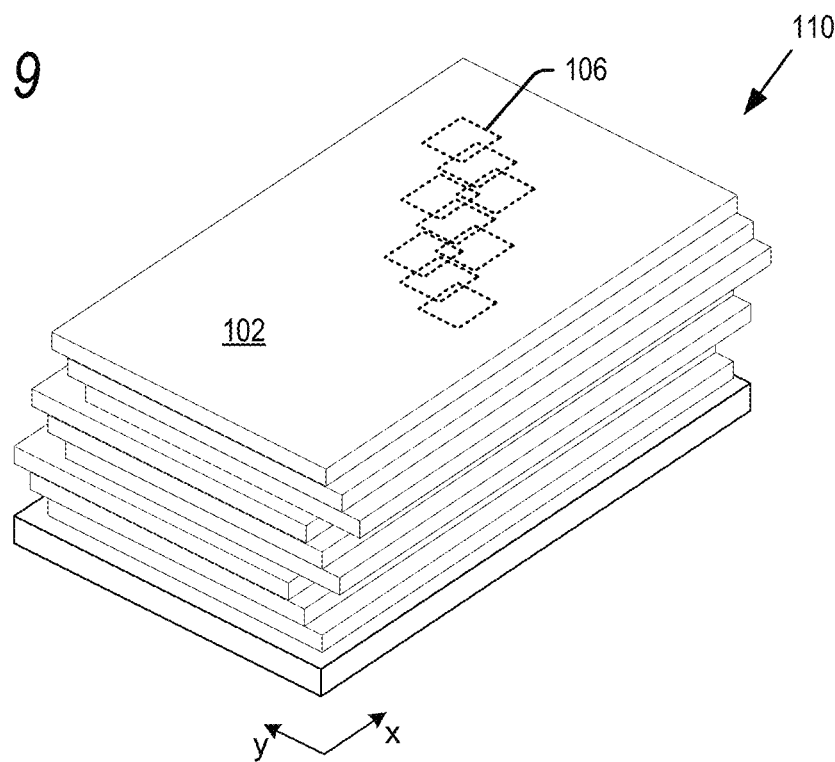
FIG. 9 is a perspective view illustrating a single die bond pad on each of the dies in the die stack according to embodiments of the present technology.

FIG. 9 shows a corresponding set of die bond pads 106 (shown in phantom) on different levels of wafers in stack 110. As can be seen, the offset of the die bond pads 106 matches the offset of the dies 102 and wafers 100.

As noted in the Background section, it is known to offset dies using TSV technology along a single axis. The wasted area would then be the offset area of each die (the offset width multiplied by the length of a die edge) for each offset. In a one-dimensional offset, the total number of linear offsets are n−1, where n is the number of dies. Thus, in an example including 9 stacked dies, the number of offsets in a one-dimensional offset are 9−1=8. Thus, in a conventional example including 9 stacked dies having an edge length of 10 mm, each with an individual offset from each other of 5 μm, the total wasted area at a single edge of the stack is given by:

Total wasted area at an edge=(9−1)×5 μm×10 mm=0.4 mm².

Figure 10:
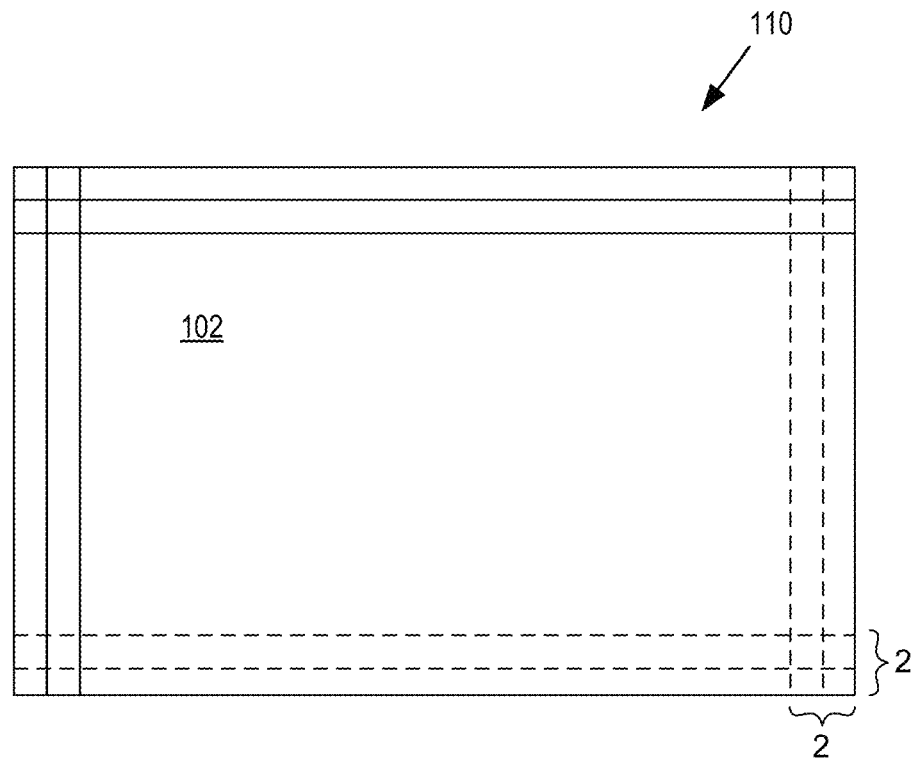
FIG. 10 is a plan view of a die stack staggered in two directions according to embodiments of the present technology.
Figure 11:
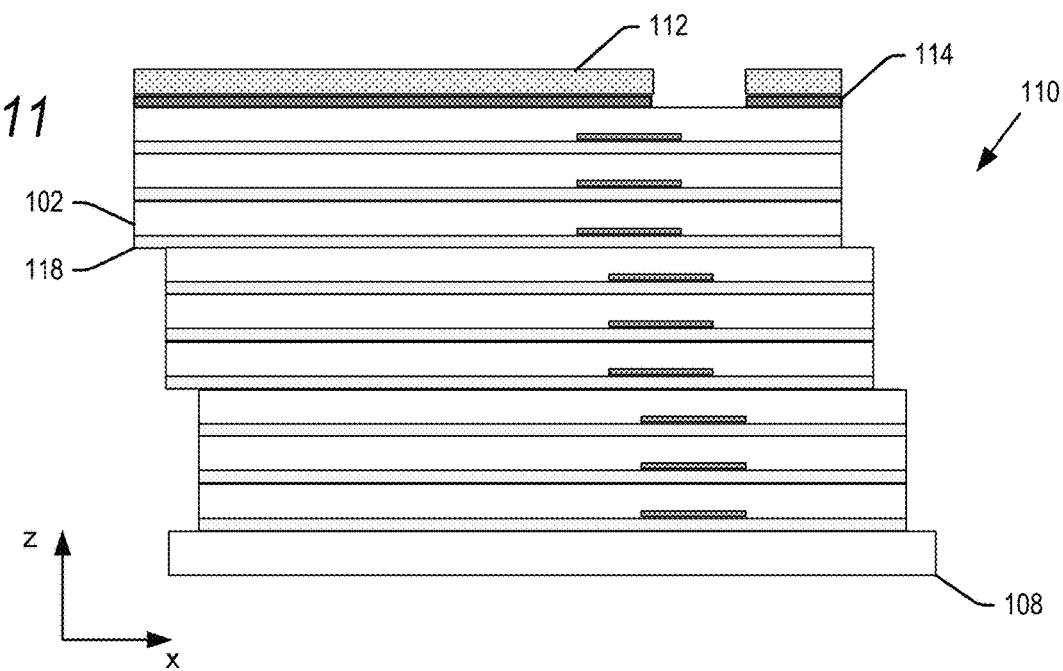
FIGS. 11-15 are cross-sectional side, edge and perspective views showing the fabrication of a via through different levels of the die stack according to embodiments of the present technology.
Figure 12:
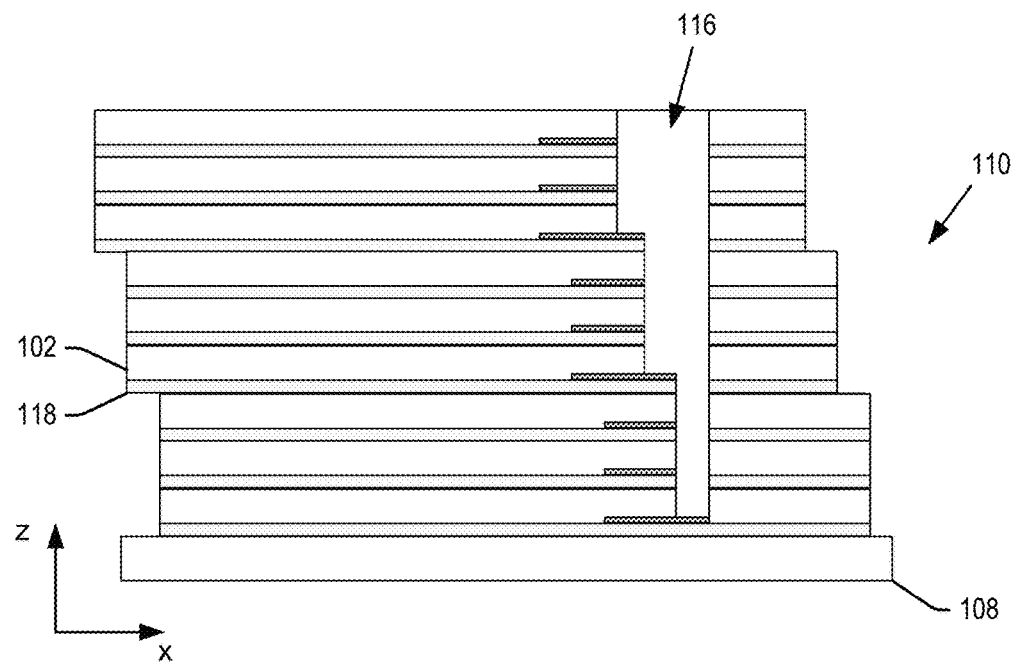
Figure 13:
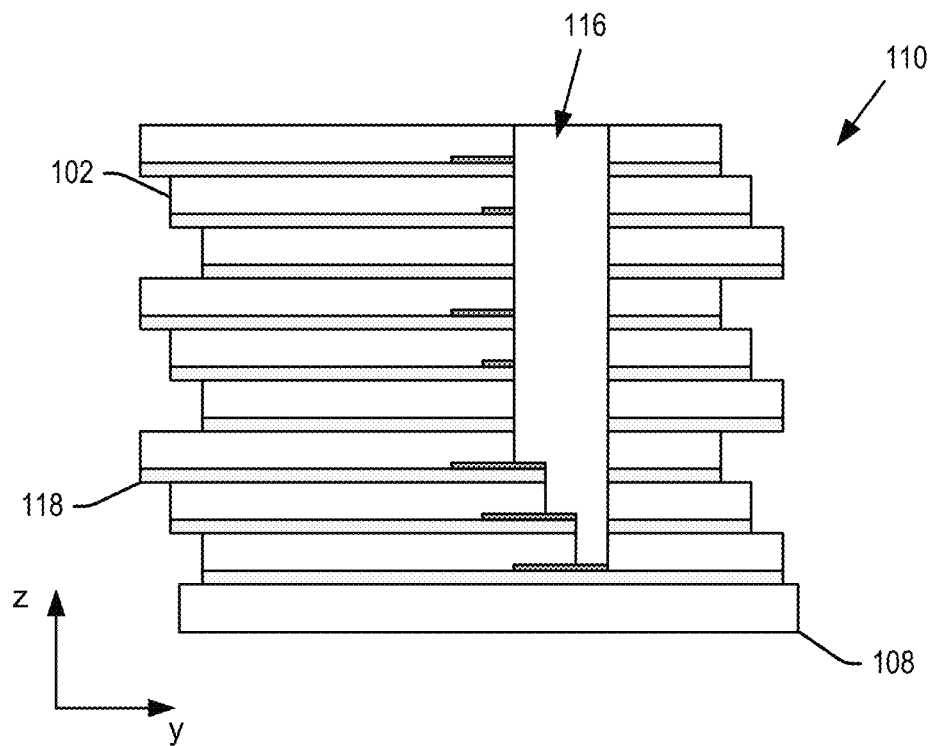

This wasted area is reduced using a two-dimensional offset of the present technology. As shown in FIG. 10, using a two-dimensional offset, the total number of offsets for the same 9 dies are 2 in the x-direction and 2 in the y-direction. Thus, assuming the same edge dimensions (10 mm) and individual offsets (5 μm) as in the above example, the total wasted area at a single edge of the stack is given by:

Total wasted area at an edge=2×5 μm×10 mm=0.1 mm².

As this wasted area is at each of the two die edges, the total wasted area is:

0.1 mm²×2=0.2 mm².

Thus, the two-dimensional stacking scheme of the present technology provides a 50% reduction in the wasted area of a die stack as compared to conventional devices. This savings occurs for all dies across the stacked wafers.

It is understood that the number of wafers (or dies) that are stacked may be different than that described above. For example, in one further example, there may be sixteen wafers (or dies) which are offset along the x- and y-axes. In such an example, there may be sets of four wafers (or dies) that are offset along a first axis, and then these sets of wafers may be stacked on each other offset along a second axis. There may be other numbers of wafers (or dies) in stack 110 in further embodiments.

Referring again to FIG. 1, once all wafers 100 are added to the stack 110, the carrier 108 may be removed from the stack 110 in step 214, as by heating or otherwise overcoming the adhesive holding the carrier 108 to the stack 110. Step 214 is shown in dashed lines as the step may be skipped and the carrier left intact for later removal as explained below. In certain embodiments, an electrical insulator 114 (FIG. 15) may be applied to an exposed surface of the topmost wafer 100 of the stack 110 in step 216. The insulator 114 may be any of various dielectric films. Step 216 is shown in dashed lines as the step of applying an insulator may be skipped in further embodiments.

In step 220, TSVs 130 may be formed down through the surface of the uppermost wafer in stack 110 and through each of the wafers in the stack to electrically couple each corresponding die bond pad in the stack to each other. Further details of step 220 will now be explained with reference to steps 224-236 and FIGS. 11-19. FIGS. 11-19 show the formation of a single TSV 130 for clarity. However, a TSV 130 may be formed through the stack 110 at each die bond pad 106 in, for example, the top wafer 100 to electrically couple each set of corresponding die bond pads in stack 110. FIGS. 11-19 also show a DAF layer 118 affixed to each semiconductor wafer 100.

In step 224, a layer of photoresist 112 (FIG. 11) may be applied over the insulator 114 or, where insulator 114 is omitted, directly on top of the surface of the uppermost wafer 100 in stack 110. The photoresist layer 112 may be patterned by removing areas of the photoresist over sections of the stack 110 where the TSVs 130 are to be formed.

In step 226, vias 116 are formed at the removed areas of photoresist 112, at the corresponding die bond pads 106 down to the stack 110. FIGS. 12-15 shows side, edge, plan and perspective views of one such via 116. As shown, the via 116 may be etched down through each successive wafer level, alternatively etching through silicon and DAF layer, until the via reaches die bond pad 106 on the last (bottommost) wafer 100.

Figure 14:
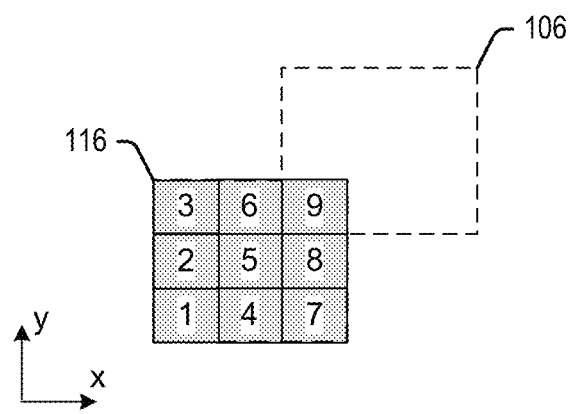

The wafers may be offset as described above to define a shift pattern along the first and second axes such that the die bond pad of each semiconductor die is exposed by the via 116. In particular, the vias 116 may each be formed with sidewalls extending along the x-axis and along the y-axis in a two-dimensional stepped fashion so that a portion of each die bond pad 106 in each set of the corresponding die bond pads is exposed. FIG. 14 is a plan view of the stack 110 showing the uppermost die bond pad 106 (on the bottom surface of the uppermost die from the perspective of for example FIG. 13). In one example, each via 116 may be 70 μm square, though the size and aspect ratio of each via may vary from that in further embodiments.

Figure 15:
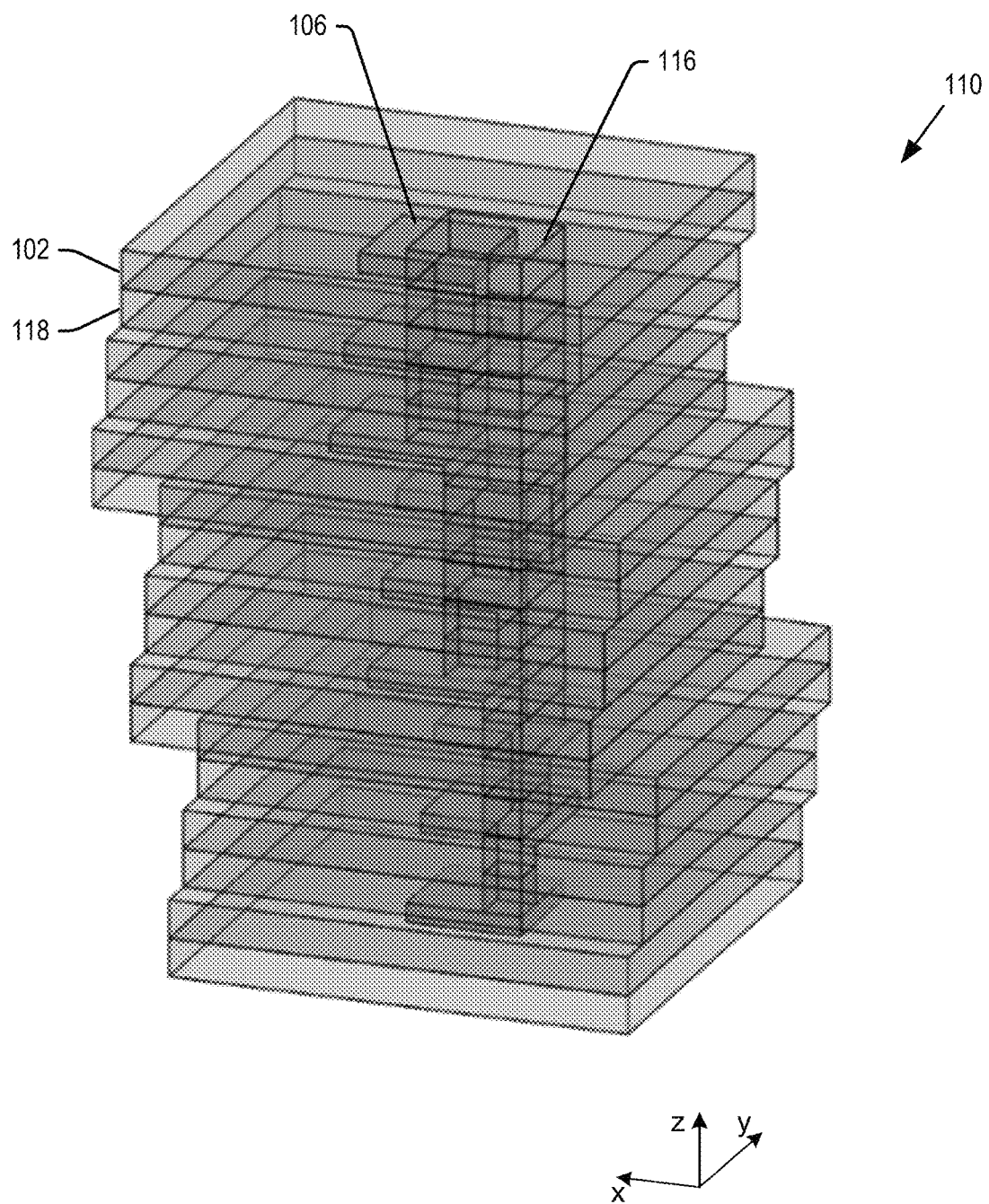

In one example, vias 116 may be etched by deep reactive-ion etching (DRIE) or other anisotropic etch process. FIG. 14 also shows the bond pads in a set of corresponding bond pads, numbered 9 (uppermost wafer 100) down to 1 (lowermost wafer 100), illustrating that the via 116 exposes a portion of each of the bond pads in the corresponding set of 9 bond pads down through the stack 110. FIG. 15 is a perspective view showing the two-dimensionally etched via 116 etched through the stack 110 (shown as slightly transparent so that the die bond pads 106 and via 116 are visible at each level of the stack 110). Each die 102 is shown with a layer of DAF 118 affixed thereto.

Figure 16:
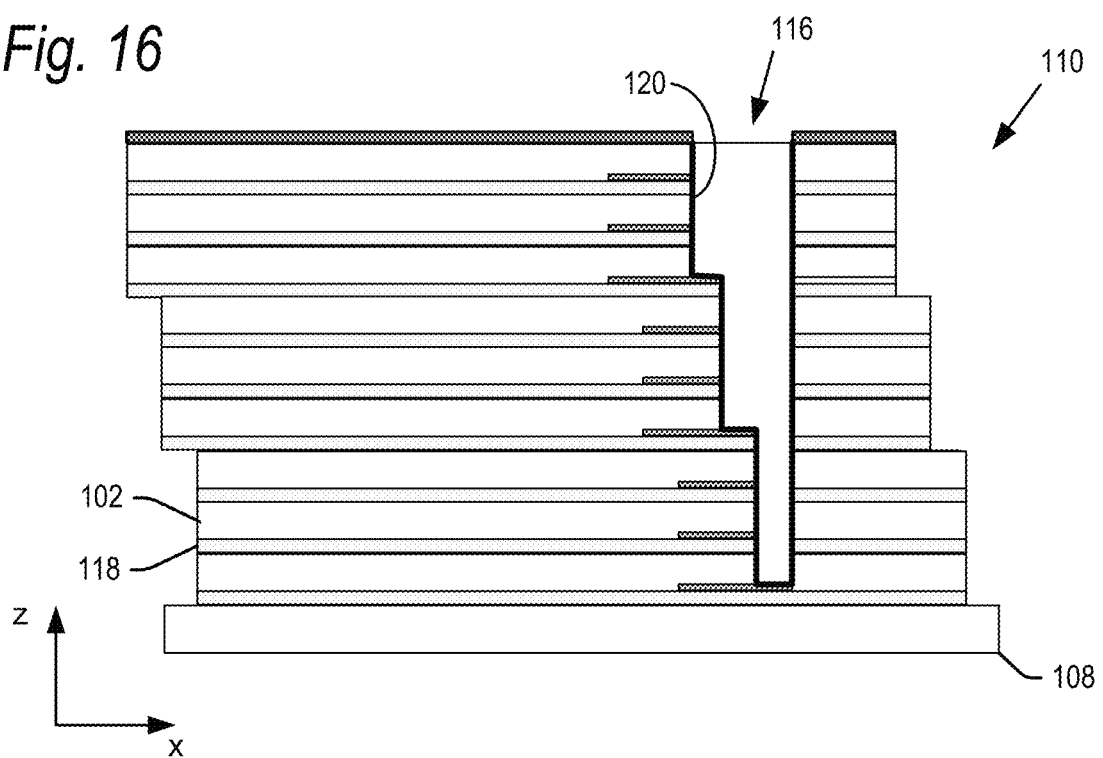
FIGS. 16-19 are cross-sectional side views showing the fabrication of a through silicon via connecting die bond pads at different levels of the die stack according to embodiments of the present technology.

In step 230, after removal of the photoresist layer, a conformal dielectric layer 120 may be applied to line the vertical and horizontal walls of the vias 116 with an electrical insulator as shown in FIG. 16. The dielectric layer 120 may be a known material applied in a known manner, such as for example silicon dioxide, alumina, a polymer or other materials applied by thermal oxidation, plasma-enhanced chemical vapor deposition (PECVD), physical vapor deposition, atomic layer deposition or other techniques.

Figure 17:
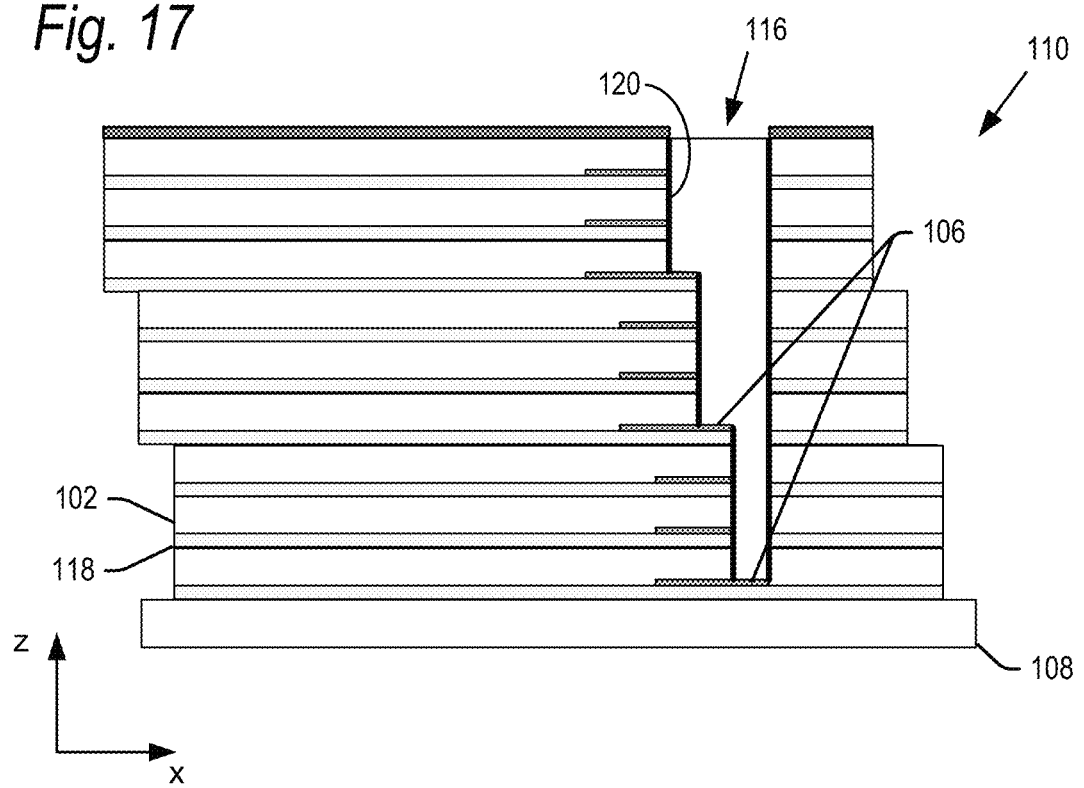

In step 232, a directional dielectric layer etch may be performed to etch away the conformal layer 120 on horizontal surfaces, i.e., the die bond pads 106, in the via 116 as shown in FIG. 17. Various methods are known for performing the directional dielectric etch step 232, including for example ion beam etching. Each of the corresponding bond pads 106 in the via 116 are exposed through the levels of wafers 100 in stack 110 after etching step 232.

As noted above, the wafers 100 may be offset from each other with the same or different offsets along the x and/or y axes. In one embodiment, one or more of the wafers toward the bottom of the stack 110 (nearest to the carrier 108) have a greater offset with respect to wafers 100 nearer the top of the stack 110. This allows a favorable aspect ratio within the vias 116.

Figure 18:
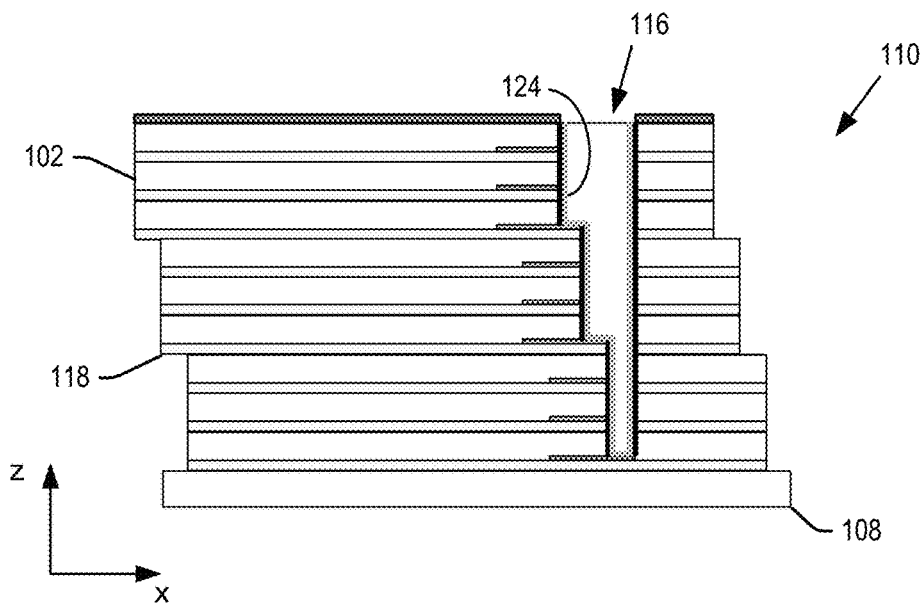
Figure 19:
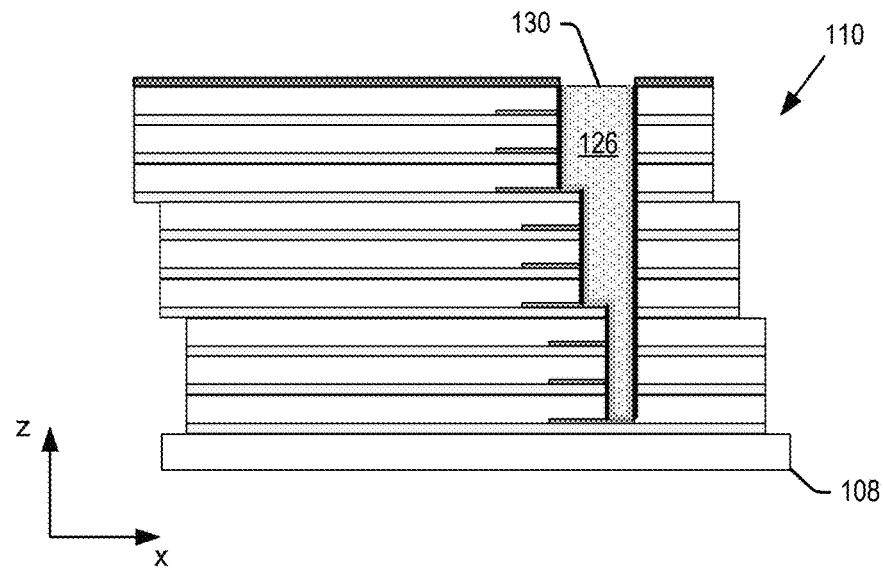

In step 234, a seed layer 124 may be deposited over all surfaces within the vias 116 as shown in FIG. 18. As is known, seed layer 124 may be any of a variety of conductive materials such as copper deposited by a variety of techniques including by physical vapor deposition (PVD) or electrografting (eG). In step 236, an electrical conductor 126 may be formed over the seed layer to fill the via 116 and complete the formation of the TSV 130 as shown in FIG. 19. The electrical conductor 126 may be a variety of conductive materials, including for example copper or tungsten, applied by various processes including electroplating or with solder using capillary action. Any excess metal, if any, may be removed by known processes, such as by lift-off, dry or wet etching process.

Figure 23:
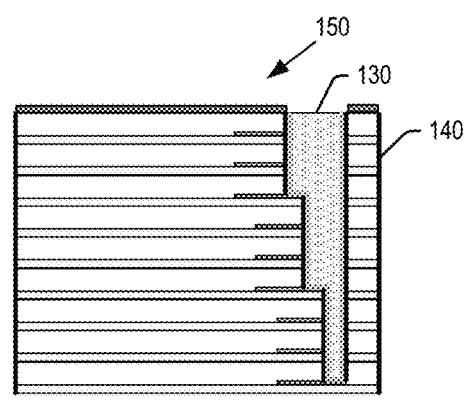
FIG. 23 is a cross-sectional side view of a completed semiconductor device according to embodiments of the present technology.

With the fabrication of the TSVs 130 across the surface of stack 110 completed, the carrier 108 may be removed (if not already done). Thereafter, individual semiconductor devices may next be diced from the wafer stack 110 in step 240 to form completed semiconductor devices 150, one of which is shown in FIG. 23.

At this point, in one embodiment, the semiconductor devices 150 (FIG. 23) may be diced from the stack 110 using known cutting methods such as by blade, laser, water jet, etc. The stack 110 may be flipped over and affixed to a dicing tape. The carrier 108 may be removed and a pick and place robot may then transfer individual semiconductor devices 150 to a host device such as a printed circuit board or substrate.

In a further embodiments of the present technology, a separate dicing step 240 may be omitted, and the individual semiconductor devices may be diced from the wafer stack 110 as part of the TSV fabrication process. Such an embodiment will now be explained with reference to FIGS. 20-23.

In embodiments where the dicing of semiconductor devices is accomplished as part of the TSV 130 formation, the layer of photoresist 112 may be applied over the insulator 114 or the surface of the uppermost wafer 100 in stack 110 in step 224 as described above. However, in this embodiment, the pattern in the photoresist further includes open lines 134 (FIG. 20) extending along the x-axis and y-axis. These open lines 134 patterned in the photoresist may extend to the edges of the wafers 100 in stack 110 and define the finished length and width of each semiconductor device to be diced from the wafer stack 110. In embodiments, the lines 134 may for example be 10 μm to 20 μm wide, though they may be wider or narrower than that in further embodiments.

Figure 22:
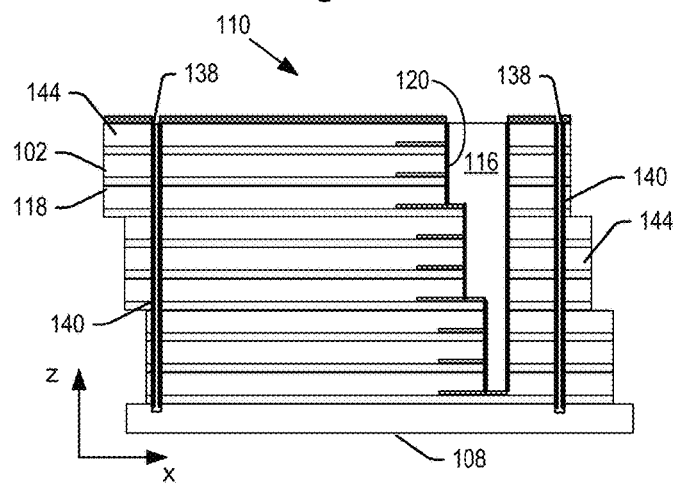

In step 226, dicing planes 138 may be formed down through each of the wafers and DAF layers in the stack 110 as shown in FIG. 21. The dicing planes may be formed at the open lines 134 in the photoresist 112, in the same deep reactive-ion etch, or other process, in which the vias 116 are formed. In step 230, the dicing planes 138 may be lined with a conformal oxide layer insulator 140, as shown in FIG. 22. The oxide layers 140 may be applied in the same process in which conformal oxide layer 120 is formed within vias 116.

Thereafter, the TSVs 130 may be completed as described above. The stack 110 may be flipped over and affixed to a dicing tape and the carrier 108 may be removed to provide the completed semiconductor device 150 shown in the side cross-sectional view of FIG. 23. A pick and place robot may transfer individual semiconductor devices 150 to a host device such as a printed circuit board or substrate. The waste area edges 144 defined by dicing planes 138 may be discarded, or can be part of adjacent die. As noted above, the amount of semiconductor material in waste area edges 144 is smaller in comparison to conventional TSV designs having a one-dimensional offset.

Figure 24:
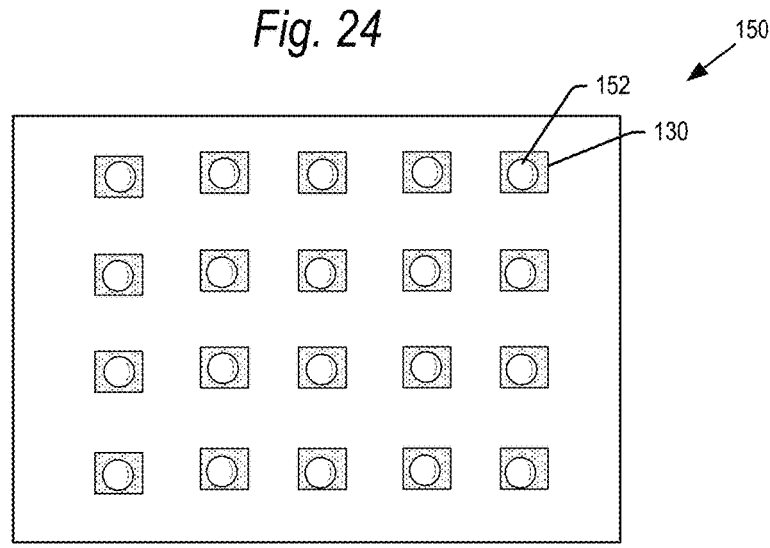
FIG. 24 is a plan view of a completed semiconductor device according to embodiments of the present technology.

FIG. 24 shows a plan view of the semiconductor device 150 showing the TSVs 130. In step 244, solder balls 152 may be applied to the TSVs to allow affixation of the semiconductor device 150 to a host device such as a printed circuit board. The step 244 of applying the solder balls 152 may be omitted in further embodiments.

In embodiments, each semiconductor device 150 is fabricated from stacked wafers. However, as indicated, dies 102 may be diced from wafer(s) 100 and thereafter stacked with a two-dimensional offset and the TSVs 130 formed as described above.

In embodiments described above, wafers and dies within stack 110 are offset from each other. As also noted, the die bond pads 106 are also highly aligned in each die and wafer so that the offset in the wafer and/or dies results in the same offset of the corresponding die bond pads on respective levels of the stack 110. However, in a further embodiment, the dies 102 in wafers 100 may be fabricated such that the die bond pads on different wafers are not aligned with each other. Instead, the corresponding die bond pads are provided with a two-dimensional offset with respect to each other along the x-axis and y-axis.

In such embodiments, the wafers 100 and/or dies 102 may be stacked within stack 110 directly aligned with each other, i.e., with no offset. The two dimensional offset is achieved by the controlled offset positions of the die bond pads in different wafers. Thus, for example, the wafers 100 and dies 102 in stack 110 may be directly aligned with each other and still achieve the two-dimensional offset of all corresponding die bond pads 106 shown in FIG. 9.

In summary, the present technology relates to a semiconductor device, comprising: a plurality of semiconductor dies stacked on top of each other with a two-dimensional offset, wherein a first group of the semiconductor dies are offset with respect to each other along a first axis, and a second group of the plurality of semiconductor dies are offset with respect to each other along a second axis that is non-parallel to the first axis; a plurality of die bond pads on each semiconductor die of the plurality of semiconductor dies; and a plurality of through silicon vias electrically coupling corresponding die bond pads in the different levels of the stacked plurality of semiconductor dies.

In another example, the present technology relates to a semiconductor device, comprising: a stack of semiconductor dies, each semiconductor die of the stack of semiconductor dies including a plurality of die bond pads distributed across surfaces of the semiconductor dies in the stack; a plurality of through silicon vias for electrically interconnecting corresponding die bond pads on different levels of the stack; wherein a single group of corresponding die bond pads of the plurality of die bond pads in the levels of the stack comprises a first group of die bond pads that are offset with respect to each other along a first axis, and a second group of die bond pads that are offset with respect to each other along a second axis that is non-parallel to the first axis In a further example, the present technology relates to a method of fabrication a semiconductor device, comprising: (a) defining a plurality of semiconductor dies in each of a plurality of semiconductor wafers, each semiconductor die of the plurality of semiconductor dies comprising a plurality of die bond pads; (b) stacking the semiconductor wafers such that a group of corresponding die bond pads through the respective layers of semiconductor wafers are offset from each other in first and second non-parallel directions; (c) forming though silicon vias through the stacked semiconductor wafers, one silicon via electrically connecting the group of corresponding die bond pads; and (d) dicing the semiconductor device from the stacked wafers.

In another example, the present technology relates to a semiconductor device, comprising: a stack of semiconductor dies, each semiconductor die of the stack of semiconductor dies including a plurality of die bond pads distributed across surfaces of the semiconductor dies in the stack; via means for electrically interconnecting corresponding die bond pads on different levels of the stack; and means for offsetting a first group of die bond pads of corresponding die bond pads in the levels of the stack from each other along a first axis, and means for offsetting a second group of die bond pads of corresponding die bond pads in the levels of the stack from each other along a second axis.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a plurality of semiconductor dies stacked on top of each other along a reference axis;
   a plurality of die bond pads on each semiconductor die of the plurality of semiconductor dies, wherein corresponding die bond pads of a first group of the semiconductor dies are offset with respect to each other along a first axis, and corresponding die bond pads of a second group of the plurality of semiconductor dies are offset with respect to each other along a second axis that is non-parallel to the first axis, the first and second axes being perpendicular to the reference axis; and
   a plurality of through silicon vias (TSVs) electrically coupling corresponding die bond pads in the different levels of the stacked plurality of semiconductor dies, a through silicon via of the TSVs extending through each of the semiconductor dies in the plurality of semiconductor dies.

2. The semiconductor device of claim 1, wherein the first and second axes are orthogonal to each other.

3. The semiconductor device of claim 1, wherein a shift pattern of the offset along the first and second axes is selected such that the die bond pad of each semiconductor die is exposed by a single vertical hole through the stack used to form a through silicon via.

4. The semiconductor device of claim 3, wherein the vertical hole is formed with two-dimensional stepped sidewalls extending along the first axis and the second axis.

5. The semiconductor device of claim 3, wherein the plurality of through silicon vias have a larger cross-sectional area at a top of the stacked semiconductor dies than at a semiconductor die distal from the top of the stacked semiconductor dies.

6. The semiconductor device of claim 1, wherein the plurality of stacked dies comprise between five and nine dies, three sets of dies being offset along the first axis with respect to each other, and each die in the three sets being offset along the second axis with respect to each other, where the sequence stops if the number of dies is less than nine.

7. The semiconductor device of claim 1, wherein the plurality of stacked dies comprise between ten and sixteen dies, four sets of dies being offset along the first axis with respect to each other, and each die in the four sets being offset along the second axis with respect to each other, where the sequence stops if the number of dies is less than sixteen.

8. The semiconductor device of claim 1, further comprising adhesive film layers for affixing the plurality of stacked semiconductor dies to each other.

9. The semiconductor device of claim 8, where the plurality of through silicon vias are formed through the adhesive film layers.

10. A semiconductor device, comprising:
    a stack of semiconductor dies stacked on each other along a reference axis, each semiconductor die of the stack of semiconductor dies including a plurality of die bond pads distributed across surfaces of the semiconductor dies in the stack;
    a plurality of through silicon vias for electrically interconnecting corresponding die bond pads on different levels of the stack;
    wherein a single group of corresponding die bond pads of the plurality of die bond pads in the levels of the stack comprises a first group of die bond pads that are offset with respect to each other along a first axis, and a second group of die bond pads that are offset with respect to each other along a second axis that is non-parallel to the first axis, the first and second axes being perpendicular to the reference axis.

11. The semiconductor device of claim 10, wherein the plurality of die bond pads are in different positions from each other on respective dies in the stack, and plurality of dies are aligned with each other.

12. The semiconductor device of claim 10, wherein a shift pattern of the offset along the first and second axes is selected such that a die bond pad of each semiconductor die is exposed by a single vertical hole through the stack used to form a through silicon via.

13. The semiconductor device of claim 12, wherein the vertical hole is formed with two-dimensional stepped sidewalls extending along the first axis and the second axis.

14. The semiconductor device of claim 12, wherein the plurality of through silicon vias have a larger cross-sectional area at a top of the stacked semiconductor dies than at a semiconductor die distal from the top of the stacked semiconductor dies.

15. A method of fabrication a semiconductor device, comprising:
    (a) defining a plurality of semiconductor dies in each of a plurality of semiconductor wafers, each semiconductor die of the plurality of semiconductor dies comprising a plurality of die bond pads;
    (b) stacking the semiconductor wafers such that a group of corresponding die bond pads through the respective layers of semiconductor wafers are offset from each other in first and second non-parallel directions;
    (c) forming though silicon vias through the stacked semiconductor wafers, one silicon via electrically connecting the group of corresponding die bond pads; and
    (d) dicing the semiconductor device from the stacked wafers.

16. The method of claim 15, wherein said step (d) of dicing the semiconductor device is performed during said step (c) of forming the through silicon vias.

17. The method of claim 15, further comprising the step of mounting the plurality of wafers on a carrier.

18. The method of claim 15, wherein the step of forming the through silicon vias comprises the step of performing a directional etching that creates a single vertical hole through the stack of wafers that exposes surfaces of the corresponding bond pads.

19. The method of claim 18, further comprising the step of metal deposition in the vertical hole that creates electrical connection to all the exposed surfaces of the corresponding bond pads.

20. The method of claim 18, wherein said step (d) of dicing the semiconductor device is performed in the same step as the directional etching that creates the single vertical hole.

21. The method of claim 15, wherein said step (b) of stacking the semiconductor wafers such that a group of corresponding die bond pads are offset from each other comprises the step of stacking the wafers with offsets in the first and second non-parallel directions.

22. A semiconductor device, comprising:
a stack of semiconductor dies stacked on each other along a reference axis, each semiconductor die of the stack of semiconductor dies including a plurality of die bond pads distributed across surfaces of the semiconductor dies in the stack;
via means for electrically interconnecting corresponding die bond pads on different levels of the stack; and
means for offsetting a first group of die bond pads of corresponding die bond pads in the levels of the stack from each other along a first axis, and means for offsetting a second group of die bond pads of corresponding die bond pads in the levels of the stack from each other along a second axis, the first and second axes being perpendicular to the reference axis.

* * * * *